United States Patent [19]

Polito et al.

[11] Patent Number: 4,837,183
[45] Date of Patent: Jun. 6, 1989

[54] SEMICONDUCTOR DEVICE METALLIZATION PROCESS

[75] Inventors: Anthony Polito, Mesa; Irenee M. Pages, Chandler, both of Ariz.

[73] Assignee: Motorola Inc., Schaumburg, Ill.

[21] Appl. No.: 189,431

[22] Filed: May 2, 1988

[51] Int. Cl.[4] .................... H01L 21/00; H01L 21/02; H01L 21/283; H01L 21/441

[52] U.S. Cl. ...................... 437/198; 437/194; 437/195; 437/197; 437/247

[58] Field of Search ........................................ 437/195

[56] References Cited

U.S. PATENT DOCUMENTS 4,381,595  5/1983  Denda et al. .................. 437/195

OTHER PUBLICATIONS

Santoro, C. J., Thermal Cycling and Surface Reconstruction in Aluminum Thin Films, J. Electrochem. Soc. 116, p. 361 (1969).

Wolf, S., Silicon Processing for the VLSI Era, Chap. 10, pp. 367–379, Lattice Press, Sunset Beach, CA, 1986.

Primary Examiner—Brian E. Hearn
Assistant Examiner—B. S. Everhart
Attorney, Agent, or Firm—Harry Wolin

[57] ABSTRACT

A metallization process for semiconductor devices wherein the metal deposition steps are performed at higher wafer temperatures than subsequent processing steps. The correlation between wafer temperature and maximum grain width is prevalent in many metals used for semiconductor device metallization such as aluminum. Therefore, by measuring and controlling the maximum grain width of the deposited metal during metal deposition steps, it is possible to control and adjust the wafer temperature.

11 Claims, 1 Drawing Sheet

U.S. Patent   Jun. 6, 1989   4,837,183
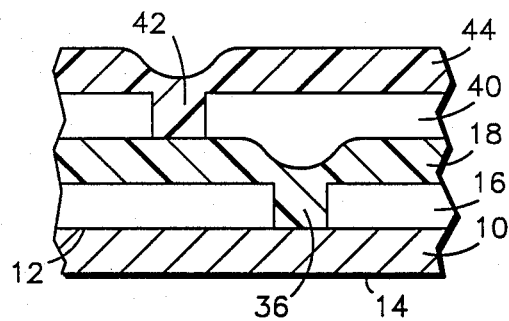
FIG. 1
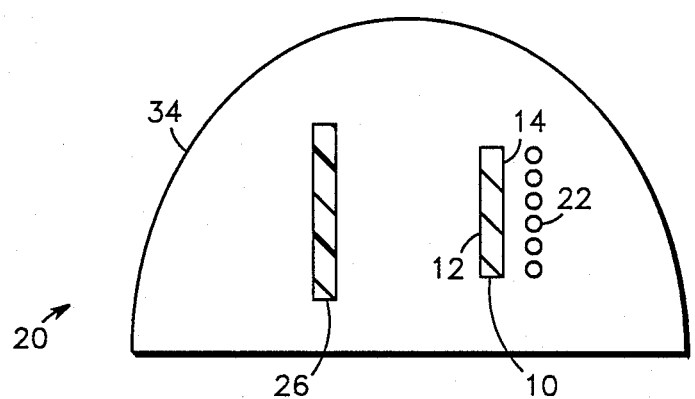
FIG. 2
FIG. 3
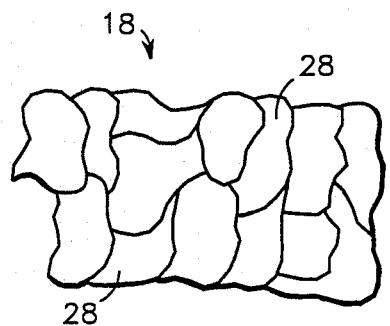
FIG. 4
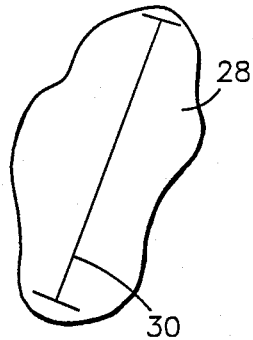

SEMICONDUCTOR DEVICE METALLIZATION PROCESS

BACKGROUND OF THE INVENTION

This invention relates, in general, to semiconductor devices, and more particularly to a metallization process for semiconductor devices wherein hillocking is greatly reduced.

Conventional metallization processes for semiconductor devices deposit metals at low temperatures and slow deposition rates. For example, conventional sputtering techniques using D.C. magnetron deposit aluminum alloys at approximately 250 degrees centigrade and 20 angstroms per second. Because these conventional methods use such low deposition temperatures, subsequent processing steps such as plasma oxide (approximately 300 degrees centigrade) and polyimide anneals (as high as 450 degrees centigrade) are performed at temperatures higher than those used in the metal deposition. The higher temperatures of the subsequent processing steps create stress throughout the metallization thereby causing severe hillocking. One skilled in the art will recognize that hillocks are protrusions of the metal caused by stress. Hillocking is detrimental in that it creates severe shorting problems between metal layers.

In semiconductor devices, metal is commonly deposited on interlayer dielectrics. Although interlayer dielectrics may be comprised of various materials, polyimide has been found to have many unique properties and characteristics such as planarization of the underlying structure which render it extremely valuable as an interlayer dielectric. However, it is extremely difficult to deposit metal on polyimide because excessive heat causes it to wrinkle. Poor electromigration characteristics are another fault of conventional metal deposition techniques. Because the electric current flowing through the metal of a semiconductor device may displace patches of metal, continuity of metal lines may be greatly affected and reduce the useful lifetime of the semiconductor device. Accordingly, a metallization process for semiconductor devices having reduced hillocking, enhanced electromigration characteristics and compatibility with interlayer dielectrics comprised of polyimide would be extremely useful.

SUMMARY OF THE INVENTION

Accordingly, it is an object of the present invention to provide a metallization process for semiconductor devices wherein hillocking in the metal layers is greatly reduced.

Another object of the present invention is to provide a metallization process for semiconductor devices having electromigration characteristics which are greatly improved.

It is an additional object of the present invention to provide a metallization process for semiconductor devices wherein polyimide materials may be successfully used as interlayer dielectrics with extremely hot metals.

Yet a further object of the present invention is to provide a metallization process for semiconductor devices wherein the wafer temperature may be controlled.

An even further object of the present invention is to provide a metallization process for semiconductor devices wherein the temperature of the wafer during metal deposition is higher than the temperature of the wafer during subsequent processing steps.

Another object of the present invention is to provide a metallization process for semiconductor devices wherein the temperature of the wafer is controlled by controlling the maximum grain width of the deposited metal.

The foregoing and other objects and advantages are achieved in the present invention by a metallization process for semiconductor devices wherein the temperature of the wafer during metal deposition is equal to or greater than the temperature of the wafer during subsequent processing steps. Because the metal is not subjected to higher temperature than that at which it was deposited, little stress will be created throughout the metal during subsequent processing steps thereby greatly reducing or eliminating hillocking. The temperature of the wafer may be controlled by measuring the maximum grain width of the deposited metal and controlling it accordingly. Further, by depositing relatively large grains of metal, electromigration properties are enhanced because grain boundaries in the direction of the current flow are greatly reduced. This only allows for minimal metal atom displacement.

A more complete understanding of the present invention can be attained by considering the following detailed description in conjunction with the accompanying drawings.

BRIEF DESCRIPTION OF THE DRAWINGS

FIG. 1 is a highly enlarged cross sectional view of a portion of a semiconductor device including metal layers;

FIG. 2 is a simplified schematic of a portion of a metal deposition apparatus having a wafer disposed thereon;

FIG. 3 is a highly enlarged cross sectional view of the semiconductor device metallization obtained using the present invention; and FIG. 4 is a highly enlarged cross sectional view of a single grain of the semiconductor metallization of FIG. 3.

DETAILED DESCRIPTION OF THE INVENTION

FIG. 1 is a highly enlarged cross sectional view of a portion of a semiconductor device. A wafer 10 includes a first surface 12 and a second surface 14. A first dielectric layer 16 is formed on wafer 10. First dielectric layer 16 may comprise many types of dielectric materials although oxides, nitrides or combinations thereof are commonly used. Once first dielectric layer 16 is formed, it is patterned and etched to form vias 36 therein. It should be understood that silicides and barrier metals may be formed and deposited at this point but this may not be essential depending on the type of device.

A first metal layer 18 is then deposited on first dielectric layer 16. Following the deposition of first metal layer 18, a first interlayer dielectric 40 is deposited thereon. In this embodiment, first interlayer dielectric 40 is comprised of polyimide although one skilled in the art will recognize that many other interlayer dielectrics may be used. Typically, polyimide is one of the more difficult materials to deposit hot metal upon because of its tendency to wrinkle when subjected to high temperature metals. However, the metallization process of the present invention works exceptionally well with polyimide first interlayer dielectric 40 because the process is performed under vacuum conditions and polyimide first interlayer dielectric 40 has been preheated and prepared prior to metal deposition. The metallization process of the present invention does not alter either the physical or chemical properties of the polyimide and therefore, no wrinkling occurs.

Following the formation of first interlayer dielectric 40, vias 42 are etched therein. A second metal layer 44 is now deposited on first interlayer dielectric 40. It should be understood that numerous interlayer dielectrics and metal layers may be employed using this same technique. The process used to deposit the metal layers will be explained hereinafter.

FIG. 2 is a simplified schematic of a portion of a metal deposition apparatus 20. Apparatus 20 is a magnetron sputtering apparatus, however, it should be understood that many types of sputtering apparatuses may be used in accordance with the present invention. Apparatus 20 includes a vacuum sputtering chamber 34 where the sputtering actually occurs. A wafer heater 22 is disposed in chamber 34 and is shown to have wafer 10 disposed thereon. It should be noted that wafer 10 is placed on wafer heater 22 so that its second surface 14 is heated by wafer heater 22. Because metal layers 18 and 44 (see FIG. 1) are deposited on various layers such as interlayer dielectric 16 which are disposed on first surface 12 of wafer 10, this type of heating is known as backside heating in the art. Backside heating is advantageous because it allows wafer 10 to absorb heat as opposed to frontside heating wherein the heat is reflected away from wafer 10 by metal layers 18 and 44 during their deposition.

Metal depostion apparatus 20 includes a target 26 aimed at wafer 10. Target 26 is a cathode which is comprised of the metal to be sputtered. In this embodiment, target 26 is comprised of aluminum alloy having 1.5% copper. However, target 26 may be comprised of pure aluminum, aluminum with 0.5% to 10.0% copper or one of many other metals well known in the art. A gas flow is injected into chamber 34 and in this embodiment, argon gas is used however one skilled in the art will recognize that many other gases may be used. The gas flow is ionized and accelerated by an electric field. The collision of gas ions with target 26 causes metal atoms to be extracted from target 26. The atoms travel through plasma and are then deposited on the layers disposed on first surface 12 of wafer 10. One skilled in the art will recognize that sputtering chamber 34 must be pressurized to point where the plasma may be ignited and the sputtering may occur.

Wafer 10, in addition to being heated by wafer heater 22, is also heated by the metal being deposited thereon. The temperature of the wafer may be represented by the following equation:

$$T_W = K_1 T_H + K_2 R t$$

where $T_W$ is the temperature of the wafer, $K_1$ is a constant associated with the wafer heater technique, $T_H$ is the temperature of wafer heater 22, $K_2$ is a constant associated with plasma conditions, R is the deposition rate of the metal and t is the time of deposition. This equation is correct for the present invention as long as R remains constant.

In depositing aluminum, aluminum alloys and various other metals, there is a correlation between the temperature of the wafer and the maximum grain width of the metal being deposited. As the temperature of the wafer increases, the maximum grain width of the deposited metal proportionately increases. Therefore, the temperature of the wafer may be kept relatively constant by measuring and controlling the maximum grain width of the deposited metal. Essentially, by keeping the maximum grain width constant, the wafer temperature is also kept constant. Modern technology allows measurement of the maximum grain width of the deposited metal to occur during metal deposition. An instrument such as a Zeiss axiomat microscope with phase contrast Knomarski and a filar eyepiece calibrated with an NBS standard at 1 micron/minor division at 1000 times may be used to do this.

FIG. 3 illustrates a highly enlarged cross sectional view of a portion of metal layer 18 while FIG. 4 is a highly enlarged view of a metal grain 28 from metal layer 18. Metal layer 18 includes a plurality of metal grains 28. Each metal grain 28 is a single crystal patch of metal. Metal grains 28 bond together during depostion to form metal layer 18. The maximum grain width of metal grains 28 is measured by taking the width of certain large metal grains 28 at their broadest portion. This is represented by line 30. Measuring the maximum grain width is much easier than methods which attempt to calculate the average grain width.

Hillocking of metal layer 18 commonly occurs when processing steps subsequent to the metal deposition have higher wafer temperature than the temperature of the wafer during the metal deposition. The higher temperature creates stress throughout metal layer 18 thereby causing protrusions (hillocks) to occur. Therefore, if the wafer temperature of subsequent processing steps is the same as or lower than the wafer temperature during the metal deposition steps, hillocking will be either eliminated or greatly reduced. Since the temperature of the wafer may be controlled by measuring and controlling the maximum grain width of metal grains 28 during metal deposition and by controlling the temperature of wafer heater 22, the metal may be deposited at relatively high temperatures that are known. This makes it possible to perform subsequent processing steps at lower temperatures. Because the metal deposition temperature is relatively high, the maximum grain width of metal grains 28 will be relatively large.

EXAMPLE

A three layer metallization scheme may be deposited using the following parameters. Following the formation of first dielectric layer 16 on first surface 12 of wafer 10, a first metal layer is deposited thereon. Wafer heater 22 is set to 475 degrees centigrade. Following heating the wafer, an aluminum alloy having 1.5% copper is deposited at a high rate of 185 angstroms per second for 41 seconds. The maximum grain width measures 10 to 14 microns and the resulting first metal layer has a thickness of 7.5 kiloangstroms. After the formation of first interlayer dielectric 40, a second metal layer is deposited after wafer heater 22 has been set at 410 degrees centigrade. The aluminum alloy is deposited at a rate of 185 angstroms per second for 97 seconds and the maximum grain width again measures 10-14 microns. The resultant second metal layer has a thickness of 18.0 kiloangstroms. Following the formation of a second interlayer dielectric, a third metal layer is then deposited on the second metal layer after wafer heater 22 has been set to 350 degrees centigrade and the wafer is heated. The aluminum alloy is deposited at a rate of 185 angstroms per second for 146 seconds while the maximum grain width remains 10 to 14 microns. The resultant third layer has a thickness of 27 kiloangstroms.

Although the example provided is very specific it should be understood that this invention may be utilized with the following parameters. The wafer temperatures may be in the range of 350 to 650 degrees centigrade, the maximum grain width of the metal being deposited may be in the range of 5.0 to 40.0 microns and the deposition rate may be in the range of 150 to 400 angstroms per second.

It should be understood that the temperature of the wafer remains relatively constant throughout all three metal deposition steps. Although the temperature of wafer heater 22 varies, the wafer is heated to a higher temperature by the increased time of subsequent metal deposition steps. In other words, the longer the deposition time, the higher the wafer temperature due to metal deposition kinetics becomes. The maximum grain width remains constant thereby insuring that the wafer temperature is constant. It should be understood that the wafer temperature during subsequent metal deposition steps need not be as high as the wafer temperature during the first metal deposition step although it is desired that the wafer temperature of all metal deposition steps remain constant, but the wafer temperature of all metal deposition steps must be higher than subsequent process steps. It should further be understood that the wafer temperature of a second or third metal deposition step must not exceed the wafer temperature of a first metal deposition step if each metal layer is to remain hillock free.

Thus it is apparent that there has been provided, in accordance with the invention, an improved metallization process for semiconductor devices which meets the objects and advantages set forth above. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of the invention.

What is claimed is:

1. A metallization process for semiconductor devices comprising the steps of:
   providing a wafer;
   forming a first dielectric layer on said wafer;
   heating said wafer; and
   depositing at least one metal layer on said first dielectric layer, the temperature of said wafer during said metal deposition being equal to or greater than the temperature of said wafer during subsequent processing steps, the wafer temperature being controlled by measuring and controlling the maximum grain width of said at least one metal layer.

2. The metallization process of claim 1 wherein the depositing step includes depositing aluminum metal.

3. The metallization process of claim 2 wherein the aluminum includes 0.5% to 10.0% copper.

4. The metallization process of claim 2 wherein the wafer temperature is in the range of 350 degrees centigrade to 650 degrees centigrade during metal deposition.

5. The metallization process of claim 4 wherein the metal being deposited has a maximum grain width in the range of 5.0 microns to 40.0 microns.

6. The metallization process of the claim 5 wherein the metal is deposited at a rate in the range of 150 angstroms per second to 400 angstroms per second.

7. A metallization process for semiconductor devices comprising the steps of:
   providing a wafer;
   forming a first dielectric layer on a first surface of said wafer;
   heating said wafer, said heat being applied to a second surface of said wafer;
   depositing a first metal layer on said first dielectric layer, the temperature of said wafer during the deposition of said first metal layer being equal to or greater than the temperature of said wafer during subsequent processing steps, the temperature of said wafer being controlled by measuring and controlling the maximum grain width of said first metal layer; and
   forming an interlayer dielectric on said first metal layer;
   depositing at least one additional metal layer on said interlayer dielectric, the temperature of said wafer during the deposition of said at least one additional metal layer being equal to or less than the temperature of said wafer during the deposition of said first metal layer but equal to or greater than the temperature of said wafer during subsequent processing steps, the temperature of said wafer being controlled by measuring and controlling the maximum grain width of said at least one additional metal layer.

8. The metallization process of claim 7 wherein the interlayer dielectric is comprised of polyimide.

9. The metallization process of claim 8 wherein the depositing steps include depositing aluminum metal.

10. The metallization process of claim 9 wherein the aluminum includes 0.5% to 10.0% copper.

11. The metallization process of claim 10 wherein the first metal layer is deposited at a rate of 185 angstroms per second for 41 seconds, the second surface of the wafer is heated at 475 degrees centigrade, the maximum grain width is 10 to 14 microns and said first metal layer is 7.5 kiloangstroms thick, a second metal layer is deposited at a rate of 185 angstroms per second for 97 seconds, said second surface of said wafer is heated at 410 degrees centigrade, the maximum grain width is 10 to 14 microns and said second metal layer is 18.0 kiloangstroms thick, and a third metal layer is deposited at a rate of 185 angstroms per second for 146 seconds, said second surface of said wafer is heated at 350 degrees centigrade, the maximum grain width is 10 to 14 microns and said third metal layer is 27.0 kiloangstroms thick.

* * * * *